United States Patent
Derai et al.

(10) Patent No.: US 12,424,521 B2
(45) Date of Patent: *Sep. 23, 2025

(54) METHOD OF MANUFACTURING SEMICONDUCTOR DEVICES AND CORRESPONDING SEMICONDUCTOR DEVICE HAVING VIAS AND PADS FORMED BY LASER

(71) Applicant: STMicroelectronics S.r.l., Agrate Brianza (IT)

(72) Inventors: Michele Derai, Milan (IT); Dario Vitello, Merate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,923

(22) Filed: Jun. 15, 2023

(65) Prior Publication Data

US 2023/0402349 A1    Dec. 14, 2023

Related U.S. Application Data

(62) Division of application No. 17/124,094, filed on Dec. 16, 2020, now Pat. No. 11,721,614.

(51) Int. Cl.
*H01L 23/495* (2006.01)
*H01L 21/56* (2006.01)
(Continued)

(52) U.S. Cl.
CPC ........ *H01L 23/49537* (2013.01); *H01L 21/56* (2013.01); *H01L 23/3121* (2013.01); *H01L 23/49579* (2013.01); *H01L 23/49827* (2013.01)

(58) Field of Classification Search
CPC ............... H01L 23/49537; H01L 21/56; H01L 23/3121; H01L 23/49579; H01L 23/49827;
(Continued)

(56) References Cited

U.S. PATENT DOCUMENTS 8,536,715 B2    9/2013    Chino
8,581,421 B2    11/2013   Shimizu et al.
(Continued)

FOREIGN PATENT DOCUMENTS

CN    105140191 A    12/2015
EP    0227371 A1    7/1987
(Continued)

OTHER PUBLICATIONS

"Supplementary: Customised Lead-Frame,", accessed on Jun. 26, 2017, 10 pages, at http://www.mtarr.co.uk/courses/topics/0264 esp/supplementary/sup_01.html.

*Primary Examiner* — Thanh Y. Tran
(74) *Attorney, Agent, or Firm* — Seed Intellectual Property Law Group LLP

(57) ABSTRACT

A System in Package, SiP semiconductor device includes a substrate of laser direct structuring, LDS, material. First and second semiconductor die are arranged at a first and a second leadframe structure at opposite surfaces of the substrate of LDS material. Package LDS material is molded onto the second surface of the substrate of LDS material. The first semiconductor die and the package LDS material lie on opposite sides of the substrate of LDS material. A set of electrical contact formations are at a surface of the package molding material opposite the substrate of LDS material. The leadframe structures include laser beam processed LDS material. The substrate of LDS material and the package LDS material include laser beam processed LDS material forming at least one electrically-conductive via providing at (Continued)

least a portion of an electrically-conductive line between the first semiconductor die and an electrical contact formation at the surface of the package molding material opposite the substrate.

16 Claims, 4 Drawing Sheets

(51) Int. Cl.
*H01L 23/31* (2006.01)
*H01L 23/498* (2006.01)

(58) Field of Classification Search
CPC ......... H01L 21/486; H01L 2224/24195; H01L 24/82; H01L 24/48; H01L 24/45
See application file for complete search history.

(56) References Cited

U.S. PATENT DOCUMENTS

| | | | |
|---|---|---|---|
| 8,686,300 | B2 | 4/2014 | Kawai et al. |
| 8,722,457 | B2 | 5/2014 | Camacho et al. |
| 9,171,739 | B1 | 10/2015 | Roh et al. |
| 10,468,344 | B2 | 11/2019 | Ziglioli |
| 11,721,614 | B2 * | 8/2023 | Derai ............ H01L 23/49537 257/668 |
| 2004/0006869 | A1 | 1/2004 | Igarashi et al. |
| 2005/0184377 | A1 | 8/2005 | Takeuchi et al. |
| 2006/0220210 | A1 | 10/2006 | Karnezos et al. |
| 2007/0144769 | A1 | 6/2007 | Salama |
| 2009/0039523 | A1 | 2/2009 | Jiang et al. |
| 2009/0263639 | A1 | 10/2009 | Dunbar et al. |
| 2010/0019370 | A1 | 1/2010 | Pressel et al. |
| 2010/0243844 | A1 | 9/2010 | Peloza et al. |
| 2010/0320585 | A1 | 12/2010 | Jiang et al. |
| 2011/0011634 | A1 | 1/2011 | Moldauer et al. |
| 2011/0024890 | A1 | 2/2011 | Yang et al. |
| 2012/0120623 | A1 | 5/2012 | Baek et al. |
| 2012/0319304 | A1 | 12/2012 | Pressel et al. |
| 2013/0329021 | A1 | 12/2013 | Fidler et al. |
| 2014/0273344 | A1 | 9/2014 | Terrill et al. |
| 2015/0021754 | A1 | 1/2015 | Lin et al. |
| 2015/0279778 | A1 | 10/2015 | Camacho et al. |
| 2016/0100256 | A1 | 4/2016 | Watson et al. |
| 2017/0077043 | A1 | 3/2017 | Takemura et al. |
| 2017/0092571 | A1 | 3/2017 | Malado et al. |
| 2017/0367182 | A1 | 12/2017 | Wu et al. |
| 2018/0342453 | A1 | 11/2018 | Ziglioli |
| 2019/0006191 | A1 | 1/2019 | Marchisi |
| 2019/0115287 | A1 | 4/2019 | Derai et al. |
| 2020/0321274 | A1 | 10/2020 | Magni |
| 2021/0050226 | A1 | 2/2021 | Derai et al. |
| 2021/0050299 | A1 | 2/2021 | Ziglioli et al. |
| 2021/0398884 | A1 | 12/2021 | Nasu |

FOREIGN PATENT DOCUMENTS

| | | |
|---|---|---|
| JP | 2009016711 A | 1/2009 |
| KR | 20000012444 A | 3/2000 |
| KR | 20070047043 A | 5/2007 |
| WO | WO 2015003175 A1 | 1/2015 |

* cited by examiner

METHOD OF MANUFACTURING SEMICONDUCTOR DEVICES AND CORRESPONDING SEMICONDUCTOR DEVICE HAVING VIAS AND PADS FORMED BY LASER

BACKGROUND

Technical Field

The description relates to manufacturing semiconductor devices.

One or more embodiments may be applied to manufacturing semiconductor devices such as integrated circuits (ICs), for instance.

Description of the Related Art

The designation System in Package (SiP) is oftentimes applied to a technology where a number of integrated circuit and/or passive components are enclosed in a single package.

System in Package layout is driven by various factors such as dice dimensions, their relative positions (side by side or stacked) and bonding pad positions.

Irrespective of a wide package and device flexibility, device bonding pad positioning may place certain limitations on SiP configurations, leading to design constraints.

As a result, a same device may not be adapted to be used in two different SiP layouts because of design incompatibility, which may involve a new device design.

BRIEF SUMMARY

One or more embodiments of the present disclosure contribute in overcoming the drawbacks discussed in the foregoing. According to one or more embodiments, the technical features which contribute to overcoming the previously discussed drawbacks can be achieved by means of a method having the features set forth in the description that follows.

One or more embodiments may relate to a corresponding semiconductor device.

The claims are an integral part of the disclosure of embodiments as provided herein.

One or more embodiments may facilitate packaging two or more dice (or chips) in a package such as a QFN-like package, using laser direct structuring (LDS) technology. QFN is an acronym for Quad-Flat No-Lead.

One or more embodiments may facilitate applying LDS technology to manufacturing semiconductor devices.

One or more embodiments may facilitate avoiding the use of conventional leadframe or complex ball grid array (BGA) substrates.

One or more embodiments may rely on a back-to-back configuration that reduces the number of LDS molding/writing/metallization steps.

One or more embodiments may facilitate achieving increased flexibility in re-using existing designs for assembling a new SiP product.

One or more embodiments may facilitate achieving a higher design flexibility.

In one or more embodiments, on board space constraints can be reduced with respect to standard SiP via molding compound layers stacked one onto another, for instance.

One or more embodiments may rely on leadframes created directly through a LDS process.

One or more embodiments may lead to reductions in production costs and times, due to waiting times for leadframe delivery being dispensed with, for instance.

One or more embodiments may facilitate achieving a high design flexibility.

One or more embodiments may provide an alternative to standard SiP.

BRIEF DESCRIPTION OF THE SEVERAL VIEWS OF THE DRAWINGS

One or more embodiments will now be described, by way of example only, with reference to the annexed figures, wherein.

It will be appreciated that, for the sake of simplicity and ease of explanation, the various figures may not be drawn to a same scale, the same possibly applying to different parts of a same figure.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments. The references used herein are provided merely for convenience and hence do not define the extent of protection or the scope of the embodiments.

Figure 1:
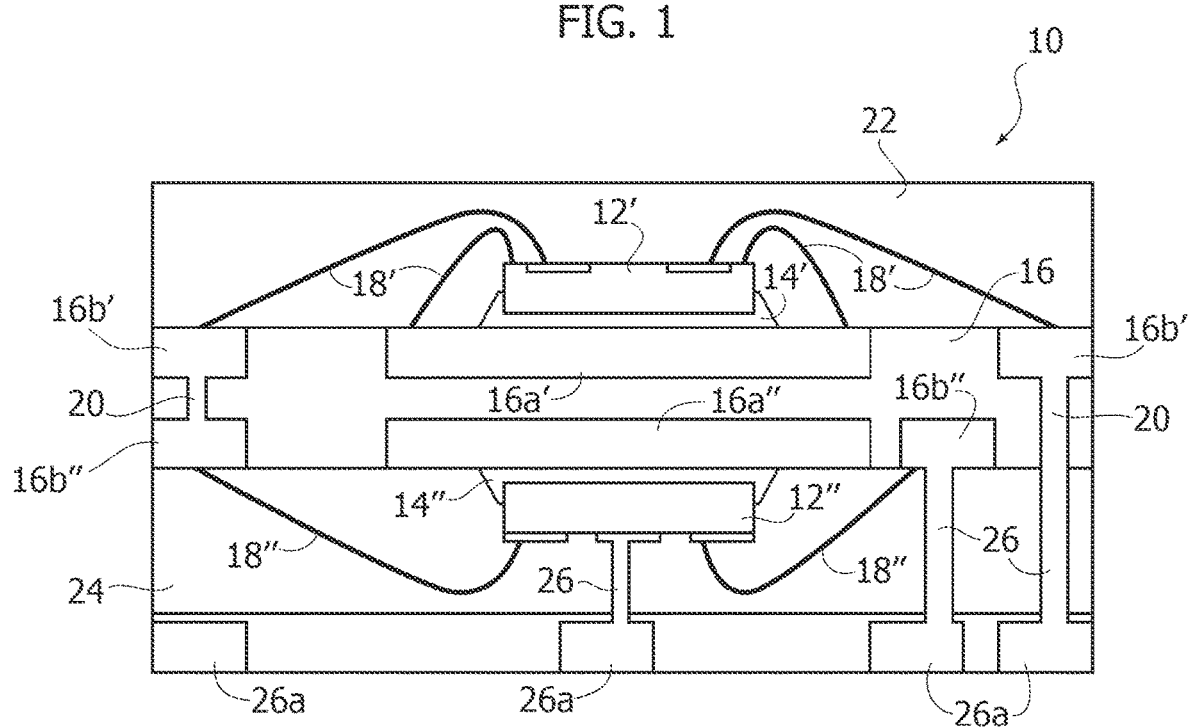
FIGS. 1 and 2 are cross-sectional views through semiconductor products to which embodiments may apply.

FIG. 1 is a cross-sectional view of a semiconductor device 10 such as an integrated circuit (IC).

As exemplified herein, the device 10 may comprise (at least one) pair of semiconductor chips or dice 12', 12" arranged, via die attach material 14', 14", for instance, on respective die pads 16a', 16a" surrounded by an array of electrically-conductive leads 16b', 16b" in a leadframe.

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Essentially, a leadframe comprises an array of electrically-conductive formations (leads) which from an outline location extend inwardly in the direction of a semiconductor chip or die thus forming an array of electrically-conductive formations from a die pad configured to have at least one semiconductor chip or die attached thereon. This may be via conventional means such as a die attach adhesive (a die attach film or DAF, for instance).

As exemplified in FIG. 1, the two semiconductor chips or dice 12', 12" are attached in a sort of back-to-back arrangement on respective die pads 16a', 16a" formed at opposed surfaces of a two-sided leadframe created using LDS technology in a layer 16 of LDS material.

Two semiconductor chips or dice 12', 12" will be exemplified throughout this description for the sake of simplicity and ease of understanding. It will be otherwise appreciated that the concepts exemplified herein can be extended to virtually any number of chips or dice in a SiP arrangement.

Laser Direct Structuring (LDS) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins which include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding which may then be subjected to metallization (for instance via electroless plating with copper or other metals) to finalize a desired conductive pattern.

As exemplified in FIG. 1, laser beam processing (possibly followed by metallization as current today in LDS technology) applied to opposed surfaces of a layer of LDS material 16 facilitates forming at these opposed surfaces die pads 16a', 16a" (optionally at a central location) and the leads 16b', 16b" (optionally at a peripheral location of the layer 16).

As exemplified in FIG. 1, electrical coupling of the semiconductor dice 12', 12" to the leads 16b', 16b" can be provided via electrically-conductive formations 18', 18" such as a (Au/Cu/Al, for instance) wire bonding pattern which couple die pads at the front surface of the semiconductor dice 12', 12" with leads 16b', 16b" in the leadframe according to a desired signal routing pattern. Clips or ribbons may equally qualify for use in the electrically-conductive formations 18', 18".

Documents such as US2019/115287 A1 or Italian patent applications 102019000014829 (corresponding to U.S. application Ser. No. 16/990,748 filed Aug. 11, 2020) and 102019000014832 (corresponding to U.S. application Ser. No. 16/994,049 filed Aug. 14, 2020) are exemplary of a possible application of LDS technology which involves laser drilling and structuring a molding compound to provide therein electrically-conductive formations. In fact, LDS technology makes it possible to replace wires, clips or ribbons with lines/vias created by laser beam processing of a LDS material possibly followed by metallization (growing metal thick copper through plating process, for instance) without using a wholly metallic leadframe.

It is noted that such an approach can be applied to System in Package (SiP) processes in order to facilitate achieving flexibility in layout design of the leadframe and interconnections.

One or more embodiments may facilitate creating (more) flexible SiP layouts by relaxing constraints on leadframe and interconnection design.

In one more embodiments as exemplified herein, LDS technology applied to System in Package (SiP) processes may take advantage of the possibility of (electrically) coupling two or more dice such as 12' and 12" regardless of their dimensions and/or their possible arrangement on different planes, which facilitates reducing overall package size with passive components possibly embedded in a package if desired.

A first example of this approach is provided in FIG. 1 by one or more vias 20 which may be formed (via LDS processing as known to those of skill in the art, including laser beam processing possibly followed by metallization) extending through the LDS material layer 16.

For instance, these vias 20 can be configured to:
(electrically) couple leads 16b' and 16b" on opposite surfaces of the leadframe, these leads in turn coupled to the dice 12' and 12", respectively: see the left-hand side of FIG. 1, for example,
cause leads such as 16b' formed on one surface (here, the upper surface) of the leadframe to become accessible on the opposite side (here, the lower surface): see the right-hand side of FIG. 1, for example.

In one or more embodiments, applying LDS technology to packaging semiconductor devices can thus facilitate creating interconnections from one or more dice to leadframe leads or substrate terminals through vias and lines.

As exemplified in FIG. 1 (and as otherwise conventional in the art), a mass of package molding compound 22 (an epoxy molding compound or EMC, for instance) can be molded onto the semiconductor die 12' and the wire bonding pattern 18' to provide an (electrically insulating) protective encapsulation.

As exemplified in FIG. 1, another mass of package molding compound 24 can be molded onto the semiconductor die 12" and the wire bonding pattern 18" to provide an similar protective encapsulation.

In one or more embodiments, the package molding compound 24 may comprise LDS material, to which LDS processing as known to those of skill in the art (including laser beam processing possibly followed by metallization) can be applied to form in the LDS compound one or more vias 26 extending through the LDS compound 24.

For instance, these vias 26 can be configured to:
cause die pads formed on the front surface (here, facing downward) of the die 12" to become accessible at the surface of the package of the device 10 (here, at the lower surface of the compound 24), via pads or lands 26a: see FIG. 1, bottom center, for example;
cause leads such as 16b' and/or 16b" formed on either surface of the leadframe layer 16 to become accessible at the surface of the package of the device 10 (here, at the lower surface of the compound 24), via pads or lands 26a: see the right-hand side of FIG. 1, for example.

In this latter case, as exemplified herein:
accessibility of leads such as 16b" formed at the lower surface of the leadframe (LDS material layer 16) at the surface of the package of the device 10 may be provided by vias 26 extending through the compound 24,
accessibility of leads such as 16b' formed at the upper surface of the leadframe (LDS material layer 16) at the surface of the package of the device 10 may be provided by vias 20 extending through the LDS material layer 16 and by vias 26 extending through the LDS compound 24.

FIG. 1 also exemplifies (left-hand side, bottom) the possibility of applying LDS processing (laser beam processing possibly followed by metallization) to the LDS compound 24 to form leadframe leads or lands (still indicated 26a for simplicity) for mounting the device 10 onto a substrate (a printed circuit board or PCB, for instance).

Figure 2:
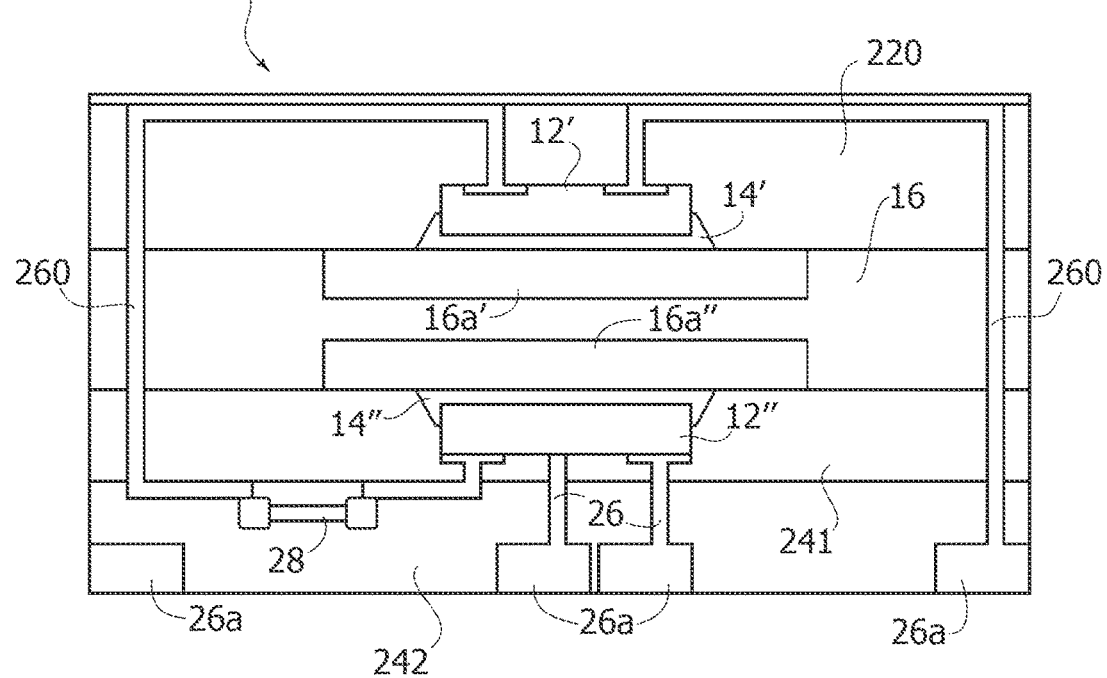

FIG. 2 is exemplary of the possibility of further extending the use of LDS technology in a SiP context as exemplified herein.

In FIG. 2, parts or elements like parts or elements already described in connection with FIG. 1 are indicated with like reference symbols. A corresponding detailed description of these parts or elements will not be repeated here for brevity.

It will be otherwise appreciated that one or more features as exemplified herein in connection with a semiconductor device 10 as exemplified in FIG. 2 can be included—separately or in combination—in a semiconductor device 10 as exemplified in FIG. 1; likewise, one or more features as exemplified herein in connection with a semiconductor device 10 as exemplified in FIG. 1 can be included—separately or in combination—in a semiconductor device 10 as exemplified in FIG. 2.

Briefly, in embodiments as exemplified in FIG. 1 LDS material is used for the leadframe layer 16 and for the lower portion 24 of the device package: conventional package molding compound (EMC, for instance) is used for the upper portion 22 of the device package.

Conversely, in embodiments as exemplified in FIG. 2 LDS material is used for the whole device package, with the package including:
a first mass 220 of LDS package molding material for the upper portion of the device package molded onto the die or chip 12' arranged at 16a' onto the upper surface of the leadframe,
a second mass of LDS package molding material (possibly comprising two portions 241, 242) for the lower portion of the device package molded onto the die or chip 12" arranged at 16a" onto the lower surface of the leadframe.

In one or more embodiments (as exemplified in both FIGS. 1 and 2) LDS material as used for the (leadframe) layer 16 and for package molding at 24, 220, 241, 242 may comprise any of a broad range of LDS materials, for instance resins such as polymer resins like PC, PC/BS, BS, LCP as currently available on the market. Optionally using for 16, 24, 20, 241, 242 a same type of LDS material or different types of LDS materials may be considered as a function of the applications contemplated.

In embodiments as exemplified in FIG. 2, LDS processing of LDS material of the (leadframe) layer 16 may provide a leadframe structure including (only) the die pads 16a' and 16a" onto which the dice 12' and 12" can be arranged (attached at 14', 14", for instance).

After molding thereon (in a single step or multiple steps at 200, 241, and possibly 242) LDS compound material electrically-conductive formations such as lines (traces) and/or vias (collectively designated 260) can be provided (in the form of an even quite complex routing of electrically-conductive formations).

In one or more embodiments, formations such as 260 can at least partly replace bonding formations such as 18' (and 18").

Again, laser processing of the LDS material may involve LDS compound activation via a laser beam, plus possible metallization such as plating to increase electrical conductivity as conventional in the art.

For instance, the lines/vias 260 can be configured to cause die pads formed on the front surface (here, facing upward) of the die 12' to become accessible at the surface of the package of the device 10 (here, at the lower surface of the compound 241, 242).

As exemplified in FIG. 2, the lines/vias 260 may include:
first vias extending from die pads formed on the front surface (here, facing upward) of the die 12' to the upper surface of the LDS compound 220,
"horizontal" lines extending at the upper surface of the LDS compound 220 towards the periphery thereof,
second vias extending along the sides of the package of the device through the LDS compound 220 and the LDS leadframe layer 16.

FIG. 2 exemplifies the possibility for the formations 260 to extend:
through the LDS compound 241, 242 to leads or lands 26a at the lower surface of the compound 241, 242, that is at the surface of the package of the device 10: see the right-hand side of FIG. 2; and/or
through the portion 241 of the LDS compound 241 to a component 28 (a passive component such as a resistor, for instance), coupled via a line/via to the die 12", with such component 28 encapsulated, and thus protected, by the portion 242 of the LDS compound 241.

FIG. 2 also exemplifies, like FIG. 1, the possibility of:
providing (by LDS processing of the LDS compound at 241 and 242) vias configured to render die pads formed on the front surface (here, facing downward) of the die 12" accessible at the surface of the package of the device 10 (here, at the lower surface of the compound 241, 242) via pads or lands 26a: see FIG. 2, bottom center, for example;
applying LDS processing to the LDS compound at 241, 242 to form leadframe leads or lands (still indicated 26a for simplicity) for mounting the device 10 on a substrate (a printed circuit board or PCB, for instance).

FIGS. 3A to 3K are exemplary of possible acts in manufacturing a semiconductor device 10 as exemplified in FIG. 1.

Those of skill in the art will otherwise appreciate that most of these acts may be applied to manufacturing a semiconductor device 10 as exemplified in FIG. 2; stated otherwise, while exemplified in connection with manufacturing a semiconductor device 10 as exemplified in FIG. 1, acts as exemplified in FIGS. 3A to 3K can be applied in manufacturing a semiconductor device 10 as exemplified in FIG. 2.

Likewise, one or more features as exemplified in connection with a semiconductor device 10 as exemplified in FIG. 2 can be included—separately or in combination—in a semiconductor device 10 as exemplified in FIG. 1.

Just by way of simple, non-limiting example, in one or more embodiments, one or both of the wire bonging patterns as exemplified at 18' and 18" in FIG. 1 (which in the case of 18' are embedded in conventional package material such as EMC, for instance) can be replaced by electrically-conductive formations formed in LDS package material by laser beam processing LDS material, possibly followed by metallization (Cu plating, for instance).

Those of skill in the art will likewise appreciate that, while manufacturing a single device 10 is exemplified here for simplicity, one or more embodiments may involve manufacturing simultaneously a plurality of devices 10 intended to be eventually separated via a "singulation" act as conventional in the art.

Figure 3A:
FIGS. 3A to 3K are exemplary of possible acts in manufacturing a semiconductor device, in accordance with one or more embodiments.
Figure 3B:
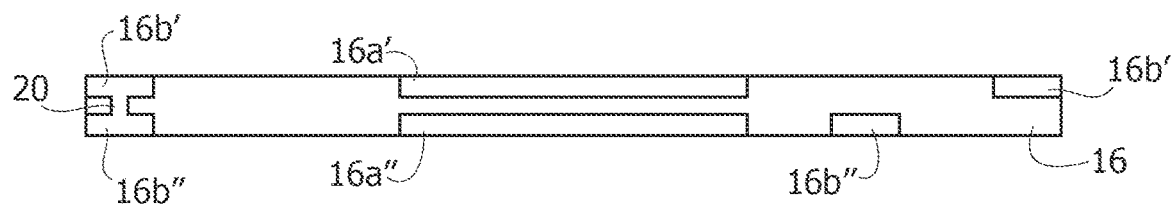
Figure 3C:
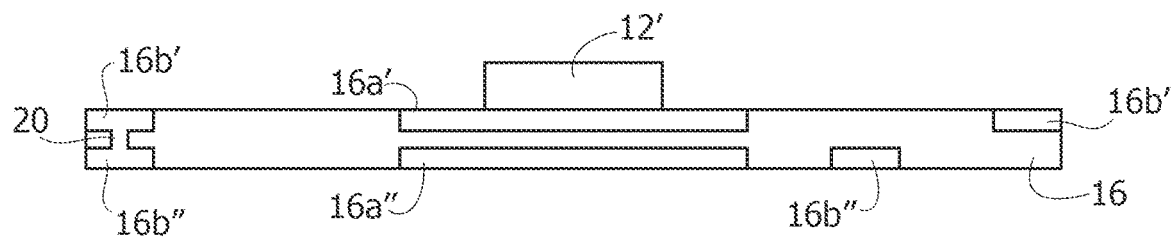
Figure 3D:
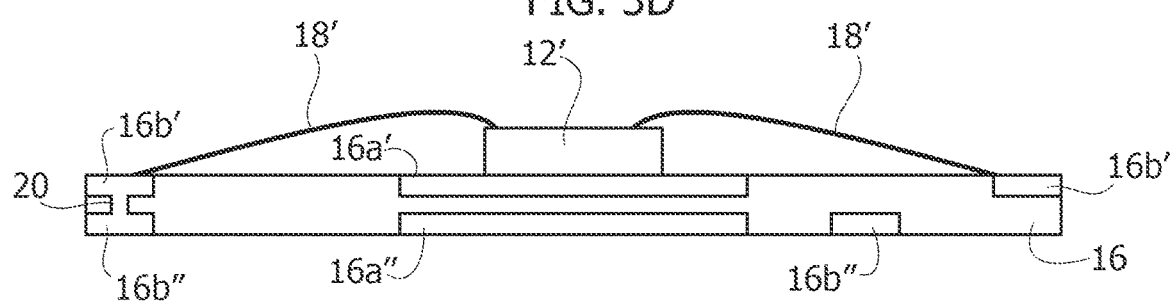
Figure 3E:
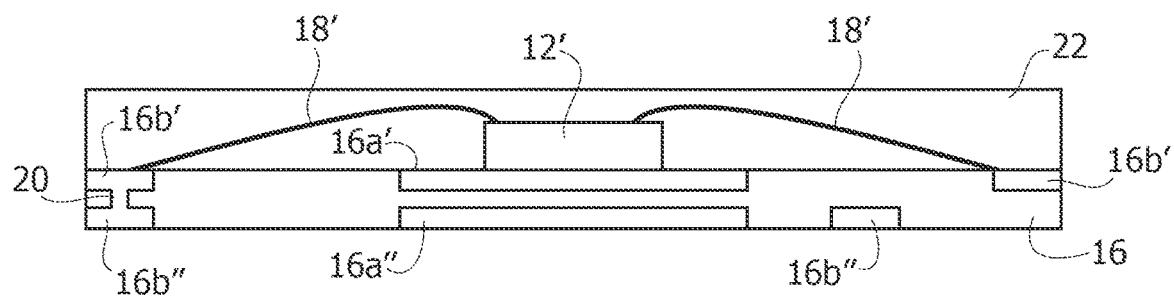
Figure 3F:
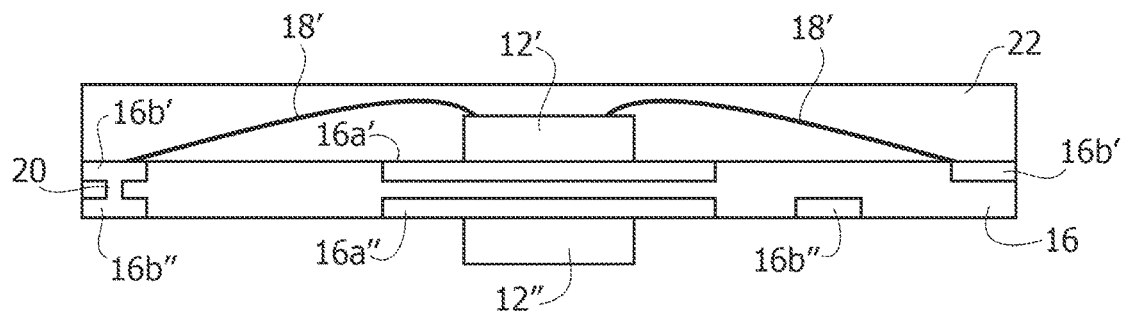
Figure 3G:
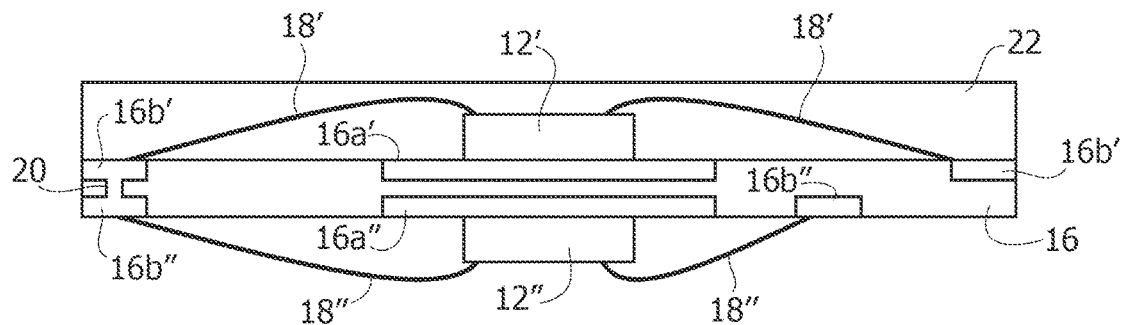
Figure 3H:
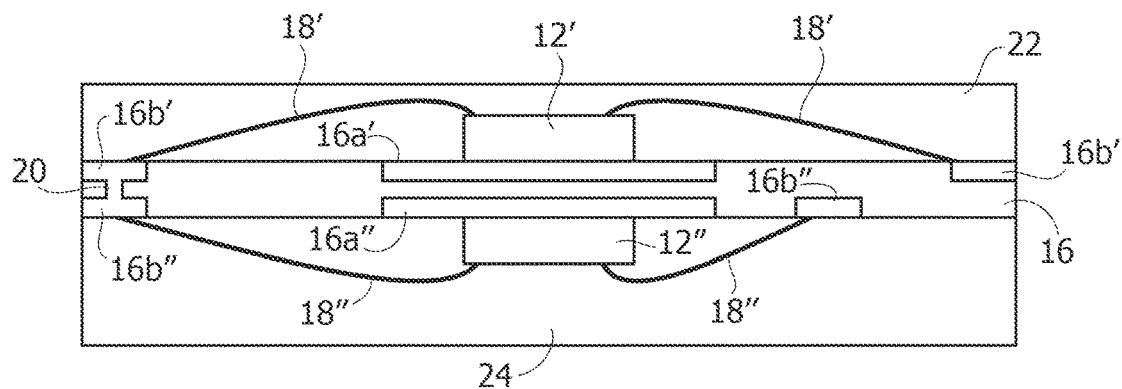
Figure 3I:
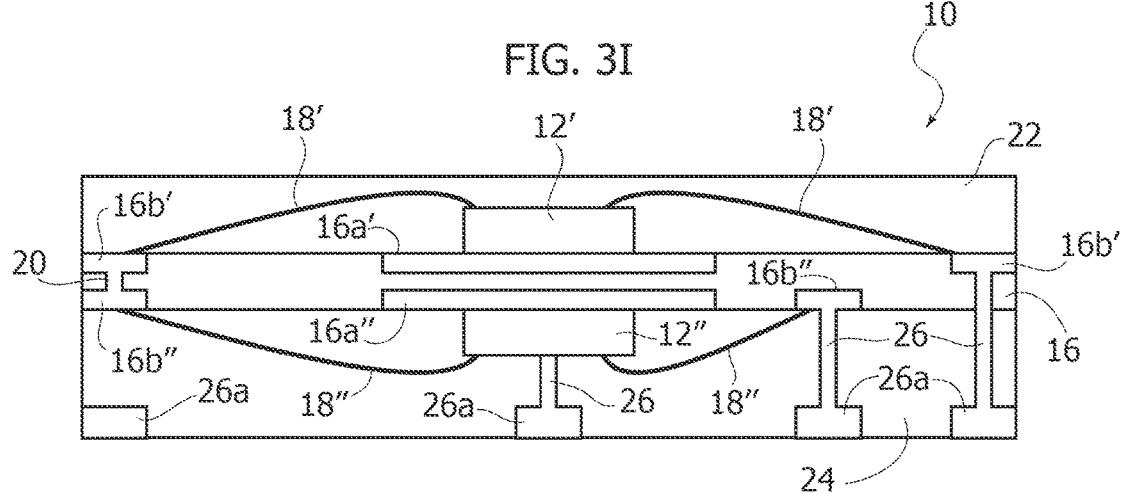
Figure 3J:
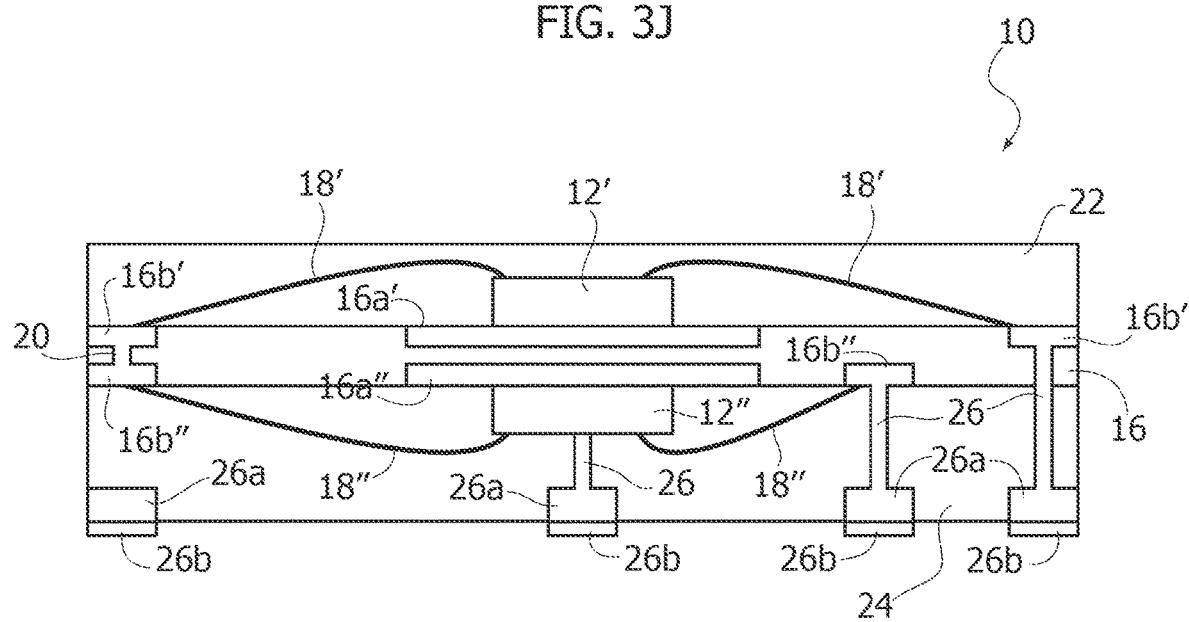
Figure 3K:
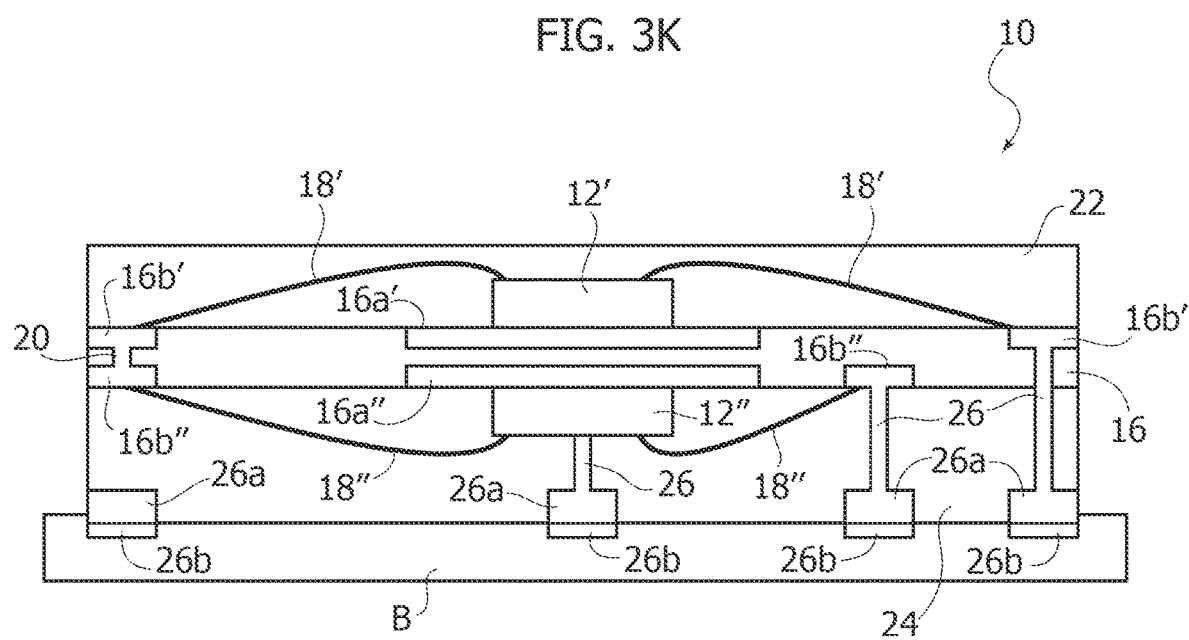

FIGS. 3A to 3K refer by way of example to the following acts (the sequence exemplified is not mandatory, insofar as at least certain acts may be performed in different order):
FIG. 3A: provision of the leadframe layer of LDS material 16;

FIG. 3B: LDS processing (laser structuring and metallization such as galvanic plating, for instance) of the leadframe layer of LDS material 16 to form of the die pads 16a', 16a" and the leads 16b', 16b" at the opposed surfaces of the layer 16 plus vias such as through the layer 16;

FIG. 3C: die 12' attached to die pad 16a' (die attach material 14' is not visible for simplicity);

FIG. 3D: provision of wire bonding 18';

FIG. 3E: (standard) package material 22 (epoxy molding compound, for instance) molded;

FIG. 3F: die 12" attached to die pad 16a" (die attach material 14" is not visible for simplicity);

FIG. 3G: provision of wire bonding 18";

FIG. 3H: LDS package material 24 molded;

FIG. 3I: LDS processing (laser structuring and metallization such as galvanic plating, for instance) of the LDS material 24 to form vias 26 and pads (lands) 26a;

FIG. 3J: plating (tin plating, for instance) of the pads 26a as exemplified at 26b;

FIG. 3K: mounting the device 10 on a substrate B (a printed circuit board or PCB, for instance).

A method as exemplified herein may comprise:

providing a substrate (for instance, 16) of laser direct structuring material (briefly, LDS material), the substrate having a first surface and a second surface, the second surface opposed to the first surface, arranging (for instance, attaching as exemplified at 14', 14") at least one first semiconductor die (for instance, 12') at a first leadframe structure (for instance, at a die pad like 16a') at the first surface of the substrate of LDS material and at least one second semiconductor die (for instance, 12") at a second leadframe structure (for instance, at a die pad like 16a") at the second surface of the substrate of LDS material (16), molding package LDS material (for instance, 24 or 241, 242) onto the second surface of the substrate of LDS material having the at least one second semiconductor die arranged at said second leadframe structure, wherein the at least one first semiconductor die and the package LDS material lie on opposite sides of the substrate of LDS material (see, for instance, FIGS. 1 and 2, where the first semiconductor die 12' is above the leadframe layer 16, while the LDS molding compound 24 or 241, 242 is under the leadframe layer 16), providing in the package LDS material a set of electrical contact formations (for instance, 26a) at a surface of the package molding material opposite the substrate of LDS material (see, for instance, FIGS. 1 and 2, where the leads or lands 26a are at the lower surface of the LDS molding compound 24 or 241, 242 opposite the leadframe layer 16 which faces the upper surface of the LDS molding compound), applying laser beam processing to the substrate of LDS material to form the first leadframe structure (for instance, 16a', 16b' in FIG. 1 or 16a' in FIG. 2) at the first surface of the substrate of LDS material and the second leadframe structure (for instance, 16a" 16b" in FIG. 1 or 16a" in FIG. 2) at the second surface of the substrate of LDS material, applying laser beam processing to the substrate of LDS material and the package LDS material (24; 241, 242) to form therein at least one electrically-conductive via (see, for instance, the vias 20 in FIG. 1 or the intermediate portion of the formations 260 extending through the leadframe layer 16 in FIG. 2) providing at least a portion of an electrically-conductive formation between said at least one first semiconductor die (for instance, 12') and an electrical contact formation (26a) in said set of electrical contact formations (for instance, 26a) at the surface of the package molding material opposite the substrate of LDS material.

A method as exemplified herein may comprise applying laser beam processing to the package LDS material (for instance, 24; 241, 242) to form therein said set of electrical contact formations (for instance, 26a) at a surface of the package molding material opposite the substrate of LDS material.

A method as exemplified herein may comprise applying laser beam processing to the substrate of LDS material to form therein a first leadframe structure and a second leadframe structure (see, for instance, 16a', 16b' and 16a", 16b" in FIG. 1) comprising a die pad (for instance, 16a' 16a", in FIG. 1) configured for arranging thereon at least one semiconductor die (12', 12") and an array of electrically-conductive leads (see, for instance, 16b', 16b" in FIG. 1).

A method as exemplified herein may comprise applying laser beam processing to the substrate of LDS material to form therein at least one electrically-conductive via through the substrate of LDS material (see, for instance, the leftmost via 20 in FIG. 1), wherein the at least one electrically-conductive via through the substrate of LDS material electrically couples an electrically-conductive lead (for instance, 16b') in the array of electrically-conductive leads in said first leadframe structure with an electrically-conductive lead (for instance, 16b") in the array of electrically-conductive leads in said second leadframe structure.

A method as exemplified herein may comprise applying laser beam processing to the package LDS material (for instance, 24) to form therein at least one electrically-conductive via (see, for instance, the second via 26 from right in FIG. 1) through the package LDS material, wherein the at least one electrically-conductive via through the package LDS material electrically couples an electrically-conductive lead in the array of electrically-conductive leads in said second leadframe structure with an electrical contact formation in the set of electrical contact formations at a surface of the package molding material opposite the substrate of LDS material, and/or applying laser beam processing to the substrate of LDS material and the package LDS material to form therein at least one electrically-conductive via ((see, for instance, the rightmost via 26 in FIG. 1) through the substrate of LDS material and the package LDS material, wherein the at least one electrically-conductive via through the substrate of LDS material and the package LDS material electrically couples an electrically-conductive lead in the array of electrically-conductive leads in said first leadframe structure with an electrical contact formation in the set of electrical contact formations at a surface of the package molding material opposite the substrate of LDS material.

A method as exemplified herein may comprise providing an electrically-conductive bonding pattern (for instance, 18', 18" in FIG. 1) between at least one semiconductor die arranged at the die pad of one of said first leadframe structure and said second leadframe structure and an electrically-conductive lead (for instance, 16b', 16b") in the array of electrically-conductive leads of the leadframe structure in said one of said first leadframe structure and said second leadframe structure.

A method as exemplified herein may comprise applying laser beam processing to the package LDS material to form therein at least one electrically-conductive via (see, for instance the vias 26 at the bottom center of both FIGS. 1 and 2) through the package LDS material, wherein the at least one electrically-conductive via through the package LDS material electrically couples said at least one second semiconductor die at a second leadframe structure at the second surface of the substrate of LDS material with an electrical contact formation in the set of electrical contact formations at a surface of the package molding material opposite the substrate of LDS material.

A method as exemplified herein may comprise:

molding further package LDS material (for instance, 220 in FIG. 2) onto the first surface of the substrate of LDS material having the at least one first semiconductor die arranged at said first leadframe structure, applying laser beam processing to said further package LDS material, to the substrate of LDS material and to the package LDS material to form therein at least one electrically-conductive formation (for instance, the lines/vias 260 in FIG. 2) electrically coupling said at least one first semiconductor die arranged at said first leadframe structure with one of:

an electrical contact formation in the set of electrical contact formations at a surface of the package molding material opposite the substrate of LDS material 16 (see, for instance, the formation 260 on the right of FIG. 2), a passive component (for instance, 28) embedded the package LDS material, the passive component optionally electrically coupled with the at least one second semiconductor die arranged at said second leadframe structure (see, for instance, the formation 260 on the left of FIG. 2)

A method as exemplified herein may comprise laser beam processing of LDS material and metallizing LDS material to which laser beam processing is applied.

A device (for instance, 10) as discussed herein may comprise features as exemplified in FIGS. 1 and 2, with the proviso that one or more features of a device 10 as exemplified in FIG. 1 may be transferred—singly or in combination—to a device 10 as exemplified in FIG. 2 while one or more features of a device 10 as exemplified in FIG. 2 may be transferred—singly or in combination—to a device 10 as exemplified in FIG. 1.

These features may comprise:

a substrate of laser direct structuring (briefly LDS), material, the substrate having a first surface and a second surface, the second surface opposed to the first surface, at least one first semiconductor die arranged at a first leadframe structure at the first surface of the substrate of LDS material and at least one second semiconductor die arranged at a second leadframe structure at the second surface of the substrate of LDS material, package LDS material molded onto the second surface of the substrate of LDS material having the at least one second semiconductor die arranged at said second leadframe structure, wherein the at least one first semiconductor die and the package LDS material lie on opposite sides of the substrate of LDS material, a set of electrical contact formations at a surface of the package molding material opposite the substrate of LDS material, wherein:

the first leadframe structure at the first surface of the substrate of LDS material and the second leadframe structure at the second surface of the substrate of LDS material comprise laser beam processed LDS material, the substrate of LDS material and the package LDS material comprise laser beam processed LDS material forming at least one electrically-conductive via providing at least a portion of an electrically-conductive formation between said at least one first semiconductor die and an electrical contact formation in said set of electrical contact formations at the surface of the package molding material opposite the substrate of LDS material.

A device as exemplified herein may comprise one or more of the following features:

said set of electrical contact formations at a surface of the package molding material opposite the substrate of LDS material comprise laser beam processed LDS material, and/or said first leadframe structure and said second leadframe structure comprise laser beam processed LDS material providing a die pad configured for arranging thereon at least one semiconductor die and an array of electrically-conductive leads, and/or at least one electrically-conductive via comprising laser beam processed LDS material is provided through the substrate of LDS material electrically coupling an electrically-conductive lead in the array of electrically-conductive leads in said first leadframe structure with an electrically-conductive lead in the array of electrically-conductive leads in said second leadframe structure, and/or at least one electrically-conductive via comprising laser beam processed LDS material is provided through the package LDS material electrically coupling an electrically-conductive lead in the array of electrically-conductive leads in said second leadframe structure with an electrical contact formation in the set of electrical contact formations at a surface of the package molding material (24) opposite the substrate of LDS material (16), and/or at least one electrically-conductive via comprising laser beam processed LDS material is provided through the substrate of LDS material and the package LDS material electrically coupling an electrically-conductive lead in the array of electrically-conductive leads in said first leadframe structure with an electrical contact formation in the set of electrical contact formations at a surface of the package molding material opposite the substrate of LDS material, and/or at least one electrically-conductive via comprising laser beam processed LDS material is provided through the package LDS material electrically coupling said at least one second semiconductor die at a second leadframe structure at the second surface of the substrate of LDS material with an electrical contact formation in the set of electrical contact formations at a surface of the package molding material opposite the substrate of LDS material, and/or further package LDS material provided molded onto the first surface of the substrate of LDS material having the at least one first semiconductor die arranged at said first leadframe structure, wherein at least one electrically-conductive formation comprising laser beam processed LDS material is provided in the further package LDS material, the substrate of LDS material and the package LDS material (24) electrically coupling said at least one first semiconductor die arranged at said first leadframe structure with one of:

an electrical contact formation in the set of electrical contact formations at a surface of the package molding material opposite the substrate of LDS material (16), a passive component embedded in the package LDS material, the passive component optionally electrically coupled with the at least one second semiconductor die arranged at said second leadframe structure.

In a device as exemplified herein, an electrically-conductive bonding pattern (for instance, 18', 18") may be provided between at least one semiconductor die arranged at the die pad of one of said first leadframe structure and said second leadframe structure and an electrically-conductive lead in the array of electrically-conductive leads of the leadframe structure in said one of said first leadframe structure and said second leadframe structure.

A device as exemplified herein may comprise metallization material (copper, for instance) at said laser beam processed LDS material.

Without prejudice to the underlying principles, the details and the embodiments may vary, even significantly, with respect to what has been described by way of example only without departing from the scope of the embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate of laser direct structuring, LDS, material, the substrate having a first surface and a second surface, the second surface opposed to the first surface;
   at least one first semiconductor die arranged at a first leadframe structure on the first surface of the substrate of LDS material and at least one second semiconductor die arranged at a second leadframe structure on the second surface of the substrate of LDS material;
   package LDS material molded onto the second surface of the substrate of LDS material having the at least one second semiconductor die arranged at said second leadframe structure, wherein the at least one first semiconductor die and the package LDS material are disposed at opposite sides of the substrate of LDS material; and
   a set of electrical contact formations on a surface of the package LDS material opposite the substrate of LDS material,
   wherein:
      the first leadframe structure at the first surface of the substrate of LDS material and the second leadframe structure at the second surface of the substrate of LDS material comprise laser beam processed LDS material, and
      the substrate of LDS material and the package LDS material comprise laser beam processed LDS material forming at least one electrically-conductive via through the substrate of LDS material and coupling at least a portion of an electrically-conductive formation between the at least one first semiconductor die and an electrical contact formation in the set of electrical contact formations at the surface of the package LDS material opposite the substrate of LDS material.

2. The device of claim 1, wherein the set of electrical contact formations at the surface of the package LDS material opposite the substrate of LDS material comprise laser beam processed LDS material.

3. The device of claim 1, wherein each of said first leadframe structure and said second leadframe structure includes laser beam processed LDS material providing a die pad configured for arranging thereon at least one semiconductor die and an array of electrically-conductive leads.

4. The device of claim 3, comprising at least one electrically-conductive via including laser beam processed LDS material extending through the substrate of LDS material and electrically coupling an electrically-conductive lead in the array of electrically-conductive leads in said first leadframe structure with an electrically-conductive lead in the array of electrically-conductive leads in said second leadframe structure.

5. The device of claim 3, comprising at least one electrically-conductive via including laser beam processed LDS material extending through the package LDS material, and electrically coupling an electrically-conductive lead in the array of electrically-conductive leads in said second leadframe structure with an electrical contact formation in the set of electrical contact formations at a surface of the package molding material opposite the substrate of LDS material; and
   at least one electrically-conductive via including laser beam processed LDS material extending through the substrate of LDS material and the package LDS material electrically coupling an electrically-conductive lead in the array of electrically-conductive leads in said first leadframe structure with an electrical contact formation in the set of electrical contact formations at a surface of the package molding material opposite the substrate of LDS material.

6. The device of claim 3, comprising at least one electrically-conductive via including laser beam processed LDS material extending through the package LDS material and electrically coupling said at least one second semiconductor die at a second leadframe structure at the second surface of the substrate of LDS material with an electrical contact formation in the set of electrical contact formations at the surface of the package molding material opposite the substrate of LDS material.

7. The device of claim 3, comprising further package LDS material molded onto the first surface of the substrate of LDS material having the at least one first semiconductor die arranged at said first leadframe structure, wherein at least one electrically-conductive formation comprising laser beam processed LDS material is provided in the further package LDS material, the substrate of LDS material and the package LDS material electrically coupling said at least one first semiconductor die arranged at said first leadframe structure with one of:
   an electrical contact formation in the set of electrical contact formations at a surface of the package molding material opposite the substrate of LDS material, or
   a passive component embedded the package LDS material, the passive component preferably electrically coupled with the at least one second semiconductor die arranged at said second leadframe structure.

8. The device of claim 1, comprising an electrically-conductive bonding pattern between at least one semiconductor die arranged at a die pad of one of said first leadframe structure and said second leadframe structure and an electrically-conductive lead in the array of electrically-conductive leads of the leadframe structure in said one of said first leadframe structure and said second leadframe structure.

9. The device of claim 1, comprising metallization material at said laser beam processed LDS material.

10. A device, comprising:
a substrate of laser direct structuring (LDS) material, the substrate having a first surface and a second surface, the second surface opposed to the first surface;
a first leadframe structure at the first surface of the substrate;
a second leadframe structure at the second surface of the substrate;
a first semiconductor die on the first leadframe structure;
a second semiconductor die on the second leadframe structure;
package LDS material on the second surface of the substrate; and
a plurality of contacts at a surface of the package LDS material;
a first conductive via extending through the substrate between the first semiconductor die and a first contact of the plurality of contacts at the surface of the package LDS material.

11. The device of claim 10, wherein a second contact of plurality of contacts at the surface of the package LDS material is coupled to a first lead of the second leadframe.

12. The device of claim 11 wherein the first lead is closer to the second semiconductor die than the first conductive via.

13. The device of claim 12 wherein the first lead is between the first conductive via and the second semiconductor die.

14. The device of claim 10, wherein each of the first leadframe structure and the second leadframe structure includes laser beam include a die pad of LDS material and an array of leads.

15. The device of claim 14, comprising a second conductive via extending through the substrate.

16. The device of claim 15, comprising a first conductive lead in the first leadframe structure, and a second conductive lead in the second leadframe structure, the second conductive via being coupled to the first and second leadframe structures.

* * * * *

UNITED STATES PATENT AND TRADEMARK OFFICE
CERTIFICATE OF CORRECTION

| | | |
|---|---|---|
| PATENT NO. | : 12,424,521 B2 | Page 1 of 1 |
| APPLICATION NO. | : 18/335923 | |
| DATED | : September 23, 2025 | |
| INVENTOR(S) | : Michele Derai et al. | |

It is certified that error appears in the above-identified patent and that said Letters Patent is hereby corrected as shown below:

On the Title Page

Item (30), insert:
--(30) Foreign Application Priority Data
Dec. 17, 2019 (IT)...........102019000024292--.

Signed and Sealed this
Eighteenth Day of November, 2025

John A. Squires
*Director of the United States Patent and Trademark Office*